(12) United States Patent
Su et al.

(10) Patent No.: US 7,476,306 B2
(45) Date of Patent: Jan. 13, 2009

(54) METHOD AND APPARATUS FOR ELECTROPLATING

(75) Inventors: Hung-Wen Su, Hsinchu (TW);
Chien-Hsueh Shih, Taipei (TW);
Ming-Hsing Tsai, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 847 days.

(21) Appl. No.: 10/814,175

(22) Filed: Apr. 1, 2004

(65) Prior Publication Data

US 2005/0224359 A1  Oct. 13, 2005

(51) Int. Cl.
*C25D 17/02* (2006.01)
(52) U.S. Cl. ....................................... 204/241
(58) Field of Classification Search ....................... None
See application file for complete search history.

(56) References Cited

U.S. PATENT DOCUMENTS

| | | | | |
|---|---|---|---|---|
| 6,042,712 A | * | 3/2000 | Mathieu | 205/209 |
| 6,221,437 B1 | * | 4/2001 | Reynolds | 205/209 |
| 6,547,937 B1 | * | 4/2003 | Oberlitner et al. | 204/245 |
| 6,830,619 B2 | * | 12/2004 | Shirley | 118/73 |

* cited by examiner

*Primary Examiner*—Harry D Wilkins, III
(74) *Attorney, Agent, or Firm*—Birch, Stewart, Kolasch & Birch, LLP

(57) ABSTRACT

Apparatus and method for metal electroplating. The apparatus for metal electroplating includes an electroplating tank for containing an electrolyte at a first temperature, a substrate holder for holding a semiconductor substrate, and a heater for heating the portion of the electrolyte adjacent to the substrate holder to a second temperature higher than the first temperature.

4 Claims, 3 Drawing Sheets

METHOD AND APPARATUS FOR ELECTROPLATING

BACKGROUND

The present invention relates to semiconductor fabrication and in particular to a method of electroplating to improve gap filling performance thereof.

Copper has become a metal of choice for filling submicron, high aspect ratio interconnect features on substrates as circuit densities increase for next generation ultra large scale integration, because copper and its alloys have lower resistivity and significantly higher electromigration resistance than aluminum. These characteristics are important to enable higher current densities at high levels of integration and increased device speed.

Choices of fabrication methods for deposition of copper into very high aspect ratio features are limited because common chemical vapor deposition processes and physical vapor deposition processes have provided unsatisfactory results. Furthermore, these processes can be costly. As a result, electroplating or electrochemical plating is becoming an accepted method of copper metallization of interconnect features on semiconductor devices. However, undesirable gap filling sometimes occurs in metal electroplating and causes poor device performance due to issues such as unoptimized tool design or chemical breakdown of the electrolyte during metal electroplating.

In U.S. Pat. No. 6,399,479, Chen et. al. disclose a process to improve electroplating fill of metal. In the U.S. Pat. No. 6,399,479 patent, a portion of the seed layer formed on sidewall portion of a semiconductor structure is removed using a electrochemical de-plating process prior to the electroplating process of the metal.

Nevertheless, conventional metal electroplating such as copper plating is performed by an electroplating apparatus under a temperature near the cleanroom temperature, and the electroplating temperature is controlled by directly adjusting the temperature of an electrolyte storage tank for supplying the electrolyte to the electroplating apparatus.

During the Cu electroplating, film qualities such as film thickness distribution or gap filling capability can be affected by the temperature of the electrolyte. Direct adjustment to the temperature of the electrolyte storage tank may seriously degrade additives such as suppressors, accelerators and levelers added therein and chemical breakdown thereof occurs in the electroplating apparatus, thus resulting in poor thickness distribution, and poor gap filling of the electroplated film or forming an electroplated film having undesirable particles thereon.

Hence, there is a need for a better electroplating method to address the potential issues such as chemical breakdown in the electrolyte, to improve the film quality of the electroplated metal film.

SUMMARY

Accordingly, an object of the invention is to provide an electroplating apparatus with a heater independent to the plating tank thereof for locally heating the portion of the electrolyte adjacent to a semiconductor substrate to a higher temperature when performing metal electroplating, thus improving metal electroplating.

The apparatus of the invention includes an electroplating tank for containing an electrolyte at a first temperature, a substrate holder for holding a semiconductor substrate, and a heater for heating the portion of the electrolyte adjacent to the substrate holder to a second temperature higher than the first temperature.

In one embodiment of the invention, the heater is disposed at a position in the electroplating tank opposite to the substrate holder.

In another embodiment of the invention, the heater is embedded in the substrate holder.

Another object of the invention is to provide a method for metal electroplating. The method of the invention includes providing an electroplating tank containing an electrolyte at a first temperature, where the electrolyte comprises metal ions. A semiconductor substrate held by a substrate holder is then immersed into the electrolyte. Next, the portion of the electrolyte adjacent to the semiconductor substrate is heated to a second temperature by a heater independent of the electroplating tank and the semiconductor substrate is then electroplated by the portion of the electrolyte at the second temperature to form a metal layer thereon.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

Figure 1:
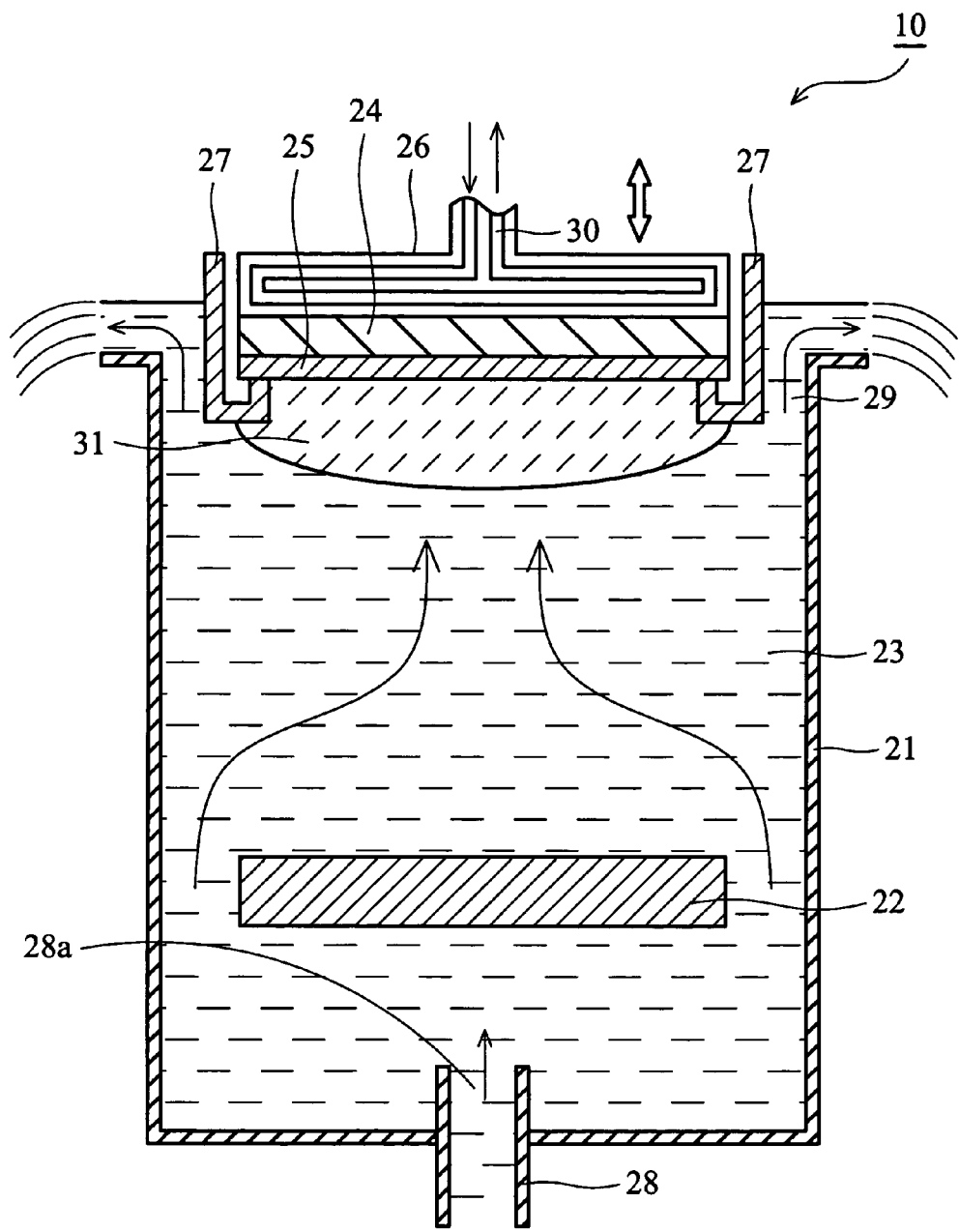
FIG. 1 is a schematic diagram showing an electroplating apparatus of the invention.
Figure 2:
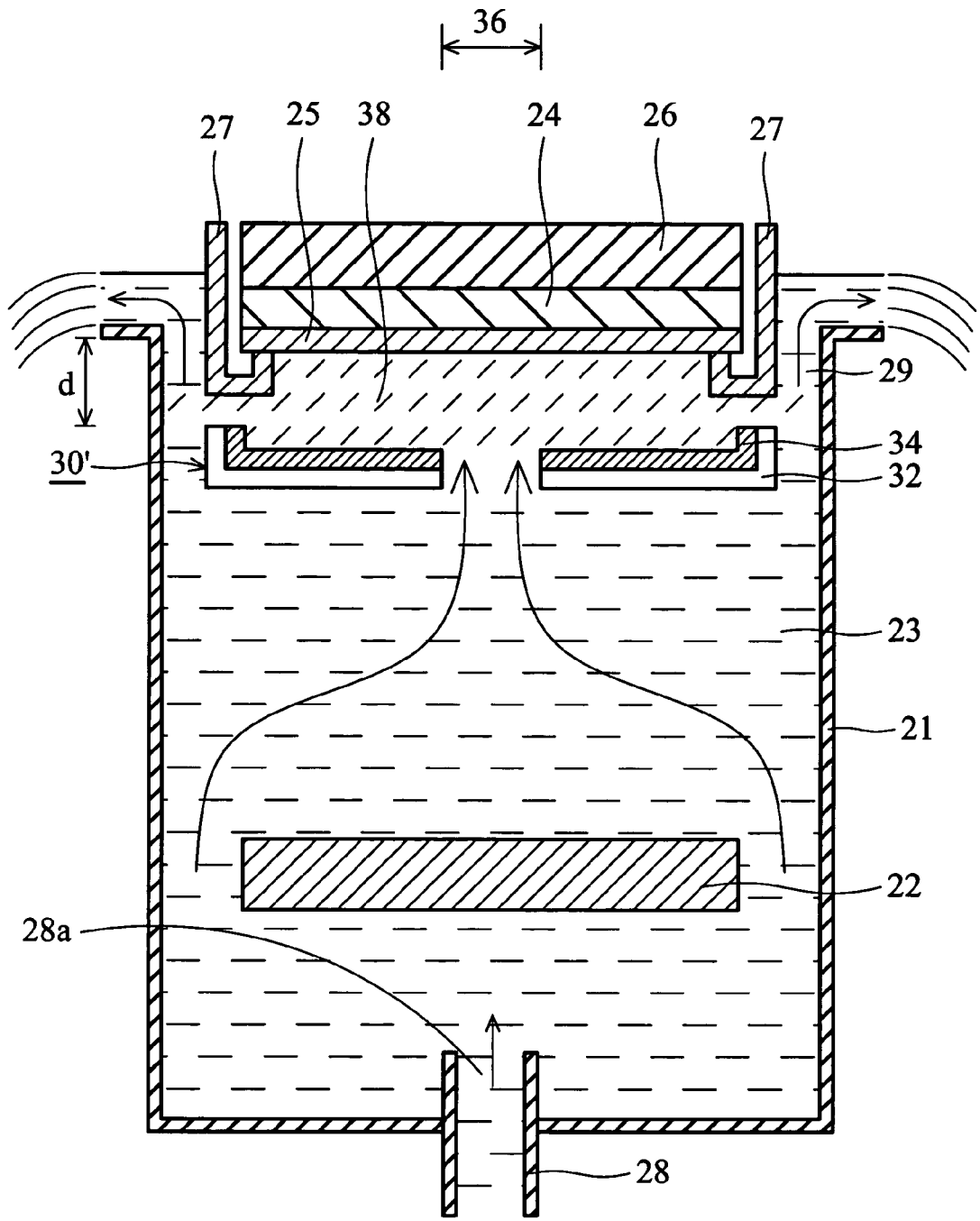
FIG. 2 is a schematic diagram showing another electroplating apparatus of the invention.

FIGS. 1 to 2 are schematic diagrams showing electroplating apparatuses capable of improving the electroplated metal quality of the invention.

In FIG. 1, an electroplating apparatus 10 in accordance with the invention for forming a metal film such as copper film applicable in integrated circuit (IC) fabrication is illustrated. The electroplating apparatus of the invention can be further modified by those skilled in the art and is not limited to the electroplating apparatus 10 in FIG. 1. The electroplating apparatus 10 includes a plating tank 21, an anode 22, an electrolyte 23, a substrate holder 26 for holding a semiconductor substrate 24, a contact electrode 27, an electrolyte inlet 28 having an opening end 28a, and an electrolyte outlet 29. The electrolyte 23 is introduced from the electrolyte inlet tube 28 into the plating tank 21, and is discharged from the electrolyte outlet 29 by overflowing. The anode 22 can be soluble or insoluble and is disposed in the lower part of the electrolyte 23, and the substrate 24 fixed to the substrate holder 26 is disposed at an upper part opposite to the anode 22. Moreover, a conductive layer 25 is deposited on the semiconductor substrate 24 as a seed layer. By disposing the semiconductor substrate 24 at an upper part of the plating tank 21, the semiconductor substrate 24 can be easily moved in and out of the plating tank 21, whereby the electroplating is performed.

In the present invention, a heater 30 independent to the plating tank 21 is disposed in the substrate holder 26 to generate and conduct heat to the semiconductor substrate 24. The heater 30 can be a heat exchange pipe containing thermal oil capable of heat exchange, as shown in FIG. 1, or an other heating element such as an electrothermal coil.

Normally, the electrolyte 23 is provided form a storage tank (not shown) at a first temperature near the cleanroom temperature, normally about 25° C. or below, and the electroplating is then performed at the first temperature. In the invention, the heater 30 is then activated to generate and conduct heat to the substrate 24 as well as the conductive layer 25 thereon to elevate the temperature of a portion of the electrolyte 23 (shown as a region 31) adjacent the conductive layer 25 to a second temperature higher than the first temperature of the other portion of the electrolyte 23. The metal electroplating is then performed through reacting the portion of electrolyte in the region 31 having a higher temperature with the conductive layer 25. Thus a metal film with improved electroplating performance such as better gap filling ability, better film uniformity and better film quality can be thus formed.

Nevertheless, chemical breakdown of additives such as suppressors in the entire electrolyte 23 can occur due to the temperature-elevated electrolyte and thus degrades results the conventional metal electroplating. In the present invention, only a small portion of electrolyte adjacent to the conductive layer 25 is heated to a higher temperature and additives in the electrolyte 23 will not be seriously degraded. Normally, the suppressors added in the electrolyte 23 during conventional metal electroplating can be poly(ethylene glycol) or poly(propylene glycol), for example. In the invention, the second temperature is preferably above 25° C. and more preferably is about 27 to 80° C., for preventing thermal degradation of additives. The temperature difference between the first temperature and the second temperature is preferably about 5 to 60° C.

Figure 3:
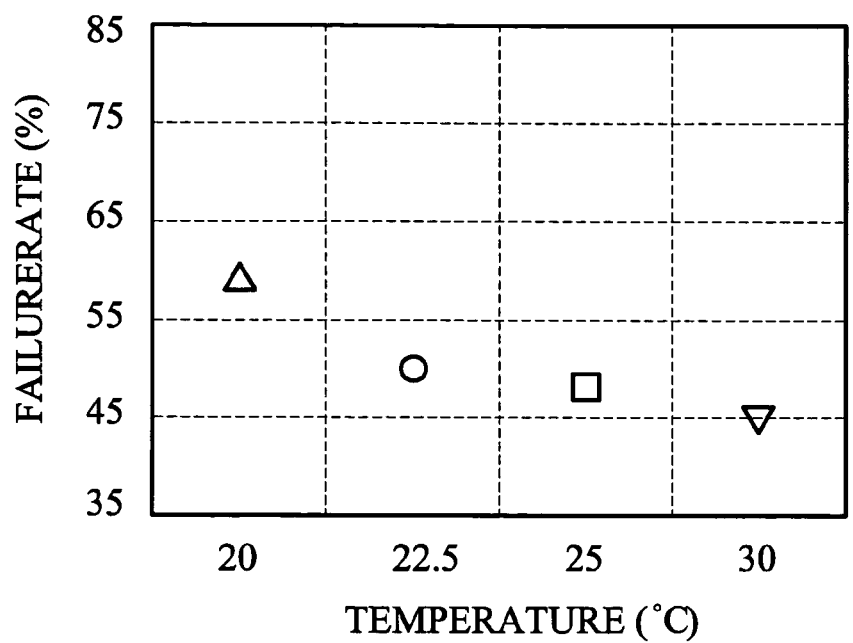
FIGS. 3 to 4 are testing results of a semiconductor device with a copper layer formed at a different electroplating temperature.

Moreover, the heater of the invention shown as the heater 30' in FIG. 3 can be directly disposed in the electroplating tank 21 rather than in the substrate holder 26 and arranged to the seed layer 25 by a distance d. The heating device 30' shown in FIG. 2 includes two individual thermal insulating supports 32 respectively having a heating element 34 thereon. An opening 36 is formed between the two thermal insulating supports 32 to allow electrolyte 23 to flow through without disturbing the electrolyte in the region 38 and the electrolyte in the region 38 can be then discharged to form the electrolyte outlet 29 by overflowing.

The distance d between the top surface of the heating element 34 and the conductive layer 25 is about 2 to 100 mm and is preferably about 5 to 50 mm to ensure the electrolyte 23 flowing therein is heated and the ions therein are electroplated onto the conductive layer 25. Thus, a region 38 having a portion of electrolyte at a second temperature can be thus formed in the plating tank 21 and the metal electroplating can be then performed. Thus, a metal film with improved electroplating performance such as better gap fill ability, better film uniformity and better film quality is achieved.

In the invention, a metal electroplating method using the modified electroplating apparatus of the invention is provided. First, an electroplating tank having an anode, an electrolyte including of a predetermined metal ion and a heater is provided. The electrolyte is provided at a first temperature and the heater is independently installed in the electroplating tank or built into the substrate holder. Next, a substrate holder for holding a substrate, for example a semiconductor substrate, with a seed layer formed thereon is provided, wherein the seed layer is connected with a cathode. The substrate is then immersed in the plating tank by the substrate holder and the portion of the electrolyte near the seed layer is heated to a second temperature by the heater and a metal electroplating is performed in the electroplating tank at the second temperature, thus forming a metal film with improved electroplating performance such as better gap filling ability, better film uniformity and better film quality.

In the prevent invention, the heater can be directly disposed in the plating tank or in the substrate holder rather than on the plating tank for performing metal electroplating such as copper electroplating. Only a portion of the electrolyte near the substrate is heated and provides metal electroplating of higher performance and higher quality. Undesirable chemical breakdown of the additives in the entire electrolyte can be thus prevented. The apparatus and the method for metal electroplating disclosed in the invention are well suited for copper electroplating in modern IC fabrication.

Figure 4:
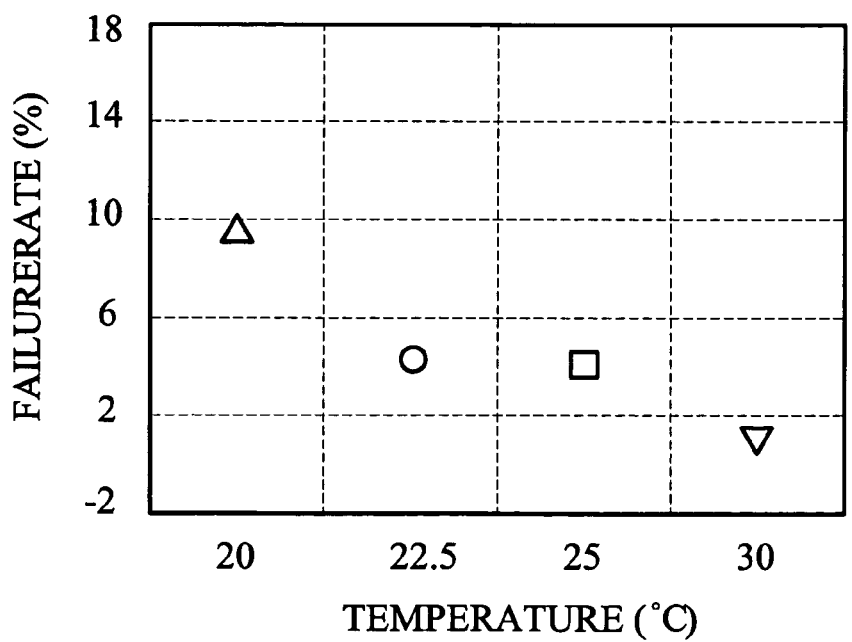

FIGS. 3 to 4 show contact resistance (Rc) test results of a semiconductor device having a copper layer formed at different electroplating temperatures. The semiconductor device in FIG. 3 includes a copper interconnect comprising a conductive line with a feature size of about 0.19 μm and an underlying via connection with a feature size of 0.17 μm. The semiconductor device in FIG. 4 includes a copper interconnect comprising a conductive line with a feature size of about 0.19 μm and an underlying via connection with a feature size of 0.18 μm. According to these Rc test results, failure rate of the semiconductor device is reduced at higher copper electroplating temperature. To prevent chemical degradation of the overall electrolyte in the plating tank, the present invention provides an electroplating apparatus applicable for locally heating a portion thereof adjacent to the semiconductor substrate for the copper plating and the plating performance is thus improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for metal electroplating, comprising:
   an electroplating tank for containing an electrolyte at a first temperature;
   a substrate holder for holding a semiconductor substrate; and
   a heater for heating the portion of the electrolyte adjacent to the substrate holder to a second temperature higher than the first temperature,
   wherein the heater comprises two individual thermal insulating supports respectively having a heating element thereon and an opening formed between the two insulating supports for allowing the electrolyte to flow therethrough, and
   wherein the heater is independently disposed in the electroplating tank and in a position opposite to the substrate holder, and the heater provides no fluid into the electroplating tank.

2. The apparatus as claimed in claim 1, wherein a temperature difference of about 5 to 60° C. exists between the second temperature and the first temperature.

3. The apparatus as claimed in claim 1, wherein the second temperature is about 27 to 80° C.

4. The apparatus as claimed in claim 1, wherein the electrolyte comprises Cu ions.

\* \* \* \* \*